(12) United States Patent
Nagaraj et al.

(10) Patent No.: US 8,536,910 B2
(45) Date of Patent: Sep. 17, 2013

(54) SYSTEM AND METHOD FOR REDUCING POWER CONSUMPTION IN A PHASED-LOCKED LOOP CIRCUIT

(75) Inventors: Krishnasawamy Nagaraj, Plano, TX (US); Ajay Kumar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 162 days.

(21) Appl. No.: 13/164,457

(22) Filed: Jun. 20, 2011

(65) Prior Publication Data
US 2012/0319734 A1 Dec. 20, 2012

(51) Int. Cl.
*H03L 7/06* (2006.01)

(52) U.S. Cl.
USPC .......................... 327/156; 327/147

(58) Field of Classification Search
USPC .................................. 327/147, 156
See application file for complete search history.

(56) References Cited

U.S. PATENT DOCUMENTS

| | | | |
|---|---|---|---|
| 7,078,947 B2 * | 7/2006 | Loh | 327/156 |
| 7,310,009 B2 * | 12/2007 | Oh | 327/156 |
| 8,111,798 B2 * | 2/2012 | Sai | 375/375 |

OTHER PUBLICATIONS

Gao, Xiang et al., "A 2.2GHz 7.6mW sub-sampling PLL with—126dBc/Hz in-band phase noise and 0.15psrms jitter in 0.18 μm CMOS," Solid-State Circuits Conference—Digest of Technical Papers, 2009. ISSCC 2009. IEEE International, Feb. 8-12, 2009, San Francisco, CA, pp. 392-393, 393a.

\* cited by examiner

*Primary Examiner* — Hai L Nguyen
(74) *Attorney, Agent, or Firm* — John R. Pessetto; Wade J. Brady, III; Frederick J. Telecky, Jr.

(57) ABSTRACT

A phased-locked loop (PLL) circuit which comprises a phase-frequency detector (PFD) configured to receive a reference signal, a voltage-controlled oscillator (VCO) configured to produce a VCO signal, and a divider configured to divide the VCO signal thereby producing a feedback signal based on the feedback signal not being locked to the reference signal. Based on the feedback signal not being locked to the reference signal, the PFD is configured to compare an edge of the reference signal with an edge of the feedback signal to produce an error signal. Based on the feedback signal being locked to the reference signal, the PFD is configured to compare the edge of the reference signal to an edge of the VCO signal to produce an error signal and the divider is configured to be disabled.

4 Claims, 5 Drawing Sheets

SYSTEM AND METHOD FOR REDUCING POWER CONSUMPTION IN A PHASED-LOCKED LOOP CIRCUIT

BACKGROUND

A microprocessor or digital signal processor typically require very accurate clocks in the multiple hundreds of megahertz or even gigahertz frequency range to run various aspects of the chip such as an analog to digital converter, memories, and the like. It is not practical to supply such high frequency clocks from outside. Instead, it is common practice to use a low frequency reference clock from outside and generate the required internal clocks using a phase lock loop which is locked to the reference clock. On some chips, numerous phased-locked loops may be employed each of which consume large amounts of power.

SUMMARY

A system and method for reducing power consumption in a phased-locked loop circuit. In one embodiment, a phased-locked loop circuit comprises a phase-frequency detector (PFD) configured to receive a reference signal, a voltage-controlled oscillator (VCO) configured to produce a VCO signal, and a divider configured to divide the VCO signal thereby producing a feedback signal based on the feedback signal not being locked to the reference signal. Based on the feedback signal not being locked to the reference signal, the PFD is configured to compare an edge of the reference signal with an edge of the feedback signal to produce an error signal. Based on the feedback signal being locked to the reference signal, the PFD is configured to compare the edge of the reference signal to an edge of the VCO signal to produce an error signal and the divider is configured to be disabled.

In another embodiment, a method includes receiving, by a phase-frequency detector (PFD), a reference signal. The method also includes producing, by a voltage-controlled oscillator (VCO), a VCO signal. The method further comprises dividing, by a divider, the VCO signal to produce a feedback signal based on the feedback signal not being locked to the reference signal. The method also includes comparing, by the PFD, an edge of the reference signal with an edge of the feedback signal to produce an error signal based on the feedback signal not being locked to the reference signal. Moreover, the method comprises comparing, by the PFD, the edge of the reference signal to an edge of the VCO signal to produce an error signal based on the feedback signal being locked to the reference signal. The method also comprises disabling the divider based on the feedback signal being locked to the reference signal.

In a further embodiment, a phase-frequency detector (PFD) comprises a delay buffer configured to receive a reference signal and produce a delayed reference signal. The PFD also comprises a first flip flop configured to receive the delayed reference signal as its C input. Further, the PFD comprises a second flip flop configured to receive a feedback signal as its C input based on the feedback signal not being locked to the reference signal and a voltage-controlled oscillator (VCO) signal as its C input based on the feedback signal being locked to the reference signal. Additionally, the PFD comprises a third flip flop configured to receive the reference signal as its C input.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In order to efficiently provide a high enough and accurate enough frequency to a processor, microprocessor, digital signal processor, or any other type of processing system, a phase-locked loop is beneficial. Because a phase-locked loop consumes a large amount of power, it is desirable to design a phase-locked loop system in a way to minimize power consumption. Embodiments of the present disclosure provide an efficient design for creating the high enough and accurate enough frequency required while minimizing the power consumption.

Figure 1:
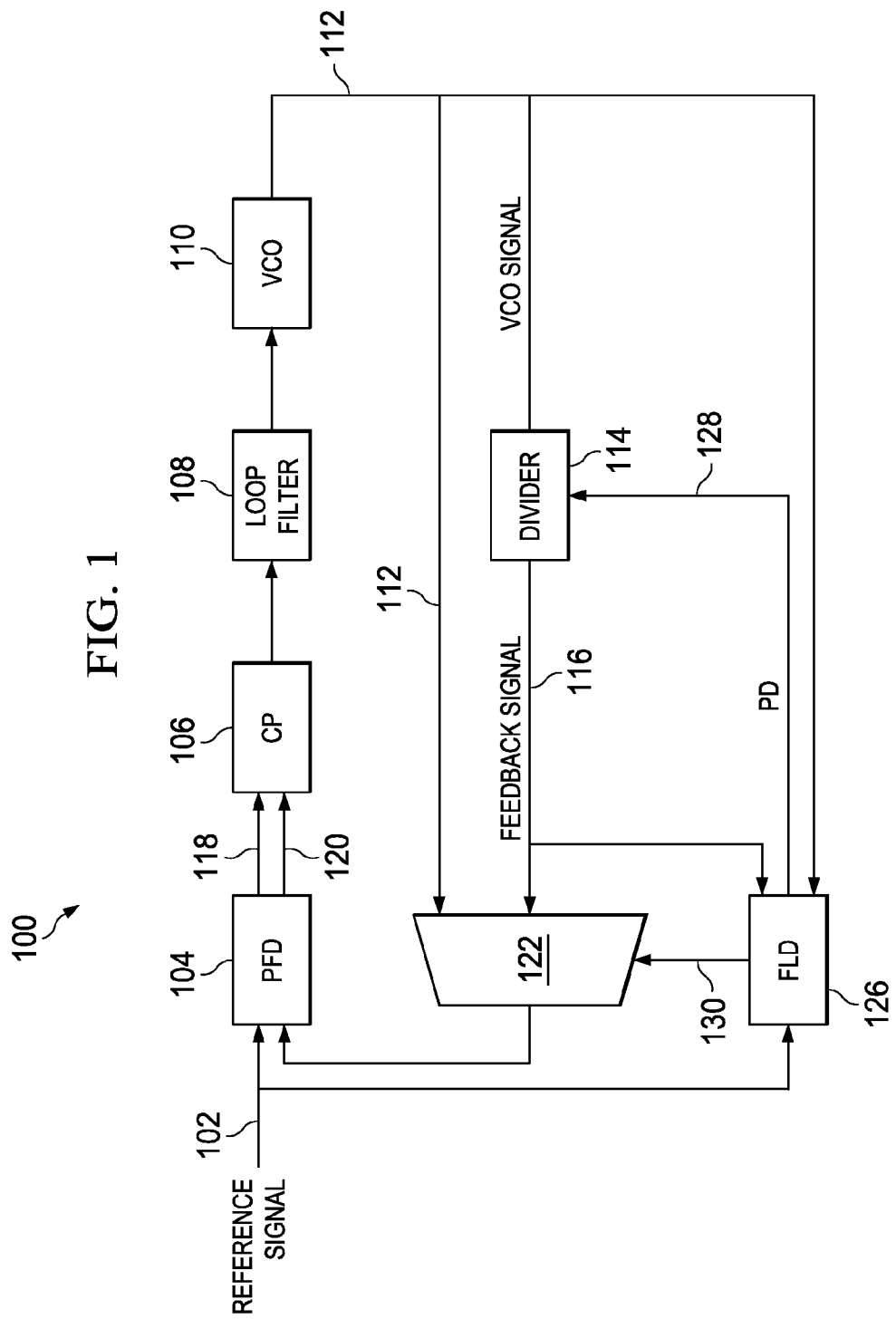
FIG. 1 shows a block diagram of a phase-locked loop circuit in accordance with various embodiments.

FIG. 1 shows a phase-locked loop (PLL) 100 which, in some embodiments, may be used to ensure a synchronicity between a reference signal 102 and a feedback signal 116 and/or a synchronicity between reference signal 102 and a VCO signal 112. The PLL 100 includes a phase-frequency detector (PFD) 104, a charge pump (CP) 106, a loop filter 108, a voltage-controlled oscillator (VCO) 110, a divider 114, a multiplexer 122, and a frequency lock detector (FLD) 126. The PLL 100 ensures feedback signal 116 is locked to reference signal 102.

In an embodiment, reference signal 102 and feedback signal 116 may be input into PFD 104. While reference signal 102 and feedback signal 116 may be any waveform, in some embodiments, they are square waves. PFD 104 then may determine the difference in frequency and/or phase between reference signal 102 and feedback signal 116. If the signals are square waves, PFD 104 may determine this difference by comparing the front edge of the reference signal 102 square wave to the front edge of the feedback signal 116 square wave. PFD 104 then may produce error signals 118 and 120 based on the amount of the frequency and/or phase difference it has detected between reference signal 102 and feedback signal 116. The error signals 118 and 120 may be designated as UP and DOWN signals or pulses.

In an embodiment, CP 106 receives the error signals 118 and 120 from PFD 104 and translates the error signals 118 and 120 into proportional positive and negative charge packets which are then fed into loop filter 108. This may cause the voltage at the output of loop filter 108 to increase or decrease based on the amount of the positive or negative charge that enters loop filter 108. The voltage is then used to tune VCO 110.

An UP signal created by PFD 104 may be an indication that reference frequency 102 is higher than feedback frequency 116 and a positive charge may thus be created to tune VCO 110 to produce a higher frequency signal. A DOWN signal created by PFD 104 may be an indication that the feedback frequency 116 is higher than reference frequency 102 and a negative charge may thus be created to tune VCO 110 to produce a lower frequency signal.

In an embodiment, these error signals then may pass through loop filter 108. Loop filter 108 may be a low pass filter which may be used to determine loop stability. Loop filter 108 may also be used to limit reference frequency energy which may appear at the PFD 104.

In an embodiment, the filtered error signals are then provided to VCO 110. VCO 110 may be an electronic oscillator configured to control oscillation frequency by a voltage input. Thus, the frequency of oscillation created is varied by the applied voltage. Based on the voltages VCO 110 receives from loop filter 108, VCO 110 tunes, or changes, the frequency and/or phase of its output to better approximate, once it is divided, reference signal 102 and outputs a signal identified as VCO signal 112. Like reference signal 102 and feedback signal 116, VCO signal 112 may take any waveform, including a square wave.

In an embodiment, VCO signal 112 is provided directly to MUX 122 bypassing frequency divider 114 and may also be provided to divider 114. Because, in some embodiments, VCO 110 produces VCO signal 112 at a higher frequency than reference signal 102, divider 114 is used to divide down VCO signal 112 and output feedback signal 116 as a signal that approximates the frequency and/or phase of reference signal 102.

In some embodiments, feedback signal 116 is then provided to FLD 126. FLD 126 may comprise counters which count the clock cycles of reference signal 102 and feedback signal 116 over a defined period of time. If the count is the same or some error value thereof (e.g., within 1%), then feedback signal 116 is considered to be locked to reference signal 102. If the count is not the same, then feedback signal 116 is not locked to reference signal 102.

In some embodiments, if feedback signal 116 is not locked to reference signal 102, FLD sends a signal 130 to MUX 122 to provide feedback signal 116 to PFD 104. Thus, a negative feedback loop is created in which if the frequency and/or phase of feedback signal 116 drifts from the frequency and/or phase of reference signal 102, the error signals created by PFD 104 will increase, which will in turn cause VCO 110 to alter the frequency and/or phase that it produces as VCO signal 112. This will lock feedback signal 116 to reference signal 102.

In an embodiment, if FLD 126 determines that feedback signal 116 is locked to reference signal 102, FLD 126 provides signal 130 to MUX 122 to provide VCO signal 112 to PFD 104. Therefore, VCO signal 112 may be provided to PFD 104 as an input along with reference signal 102. Hence, divider 114 no longer becomes necessary and may be disabled or powered down by power down signal 128 sent from FLD 126. Once divider 114 is disabled, PLL 100 may conserve energy as divider 114 would no longer be consuming any energy.

In an embodiment, because feedback signal 116 is no longer being input into PFD 104, the frequency and/or phase of VCO signal 112 must be compared to frequency and/or phase of reference signal 102 in order to maintain a lock between the two signals. In order to accomplish this, if VCO signal 112 and reference signal 102 are square waves, PFD 104 may compare the leading edge of reference signal 102 with a leading edge of VCO signal 112 in order to produce the error signals 118 and 120. Then CP 106, loop filter 108, and VCO 110 may perform the same way as discussed above, thus producing VCO signal 112 which remains locked to reference signal 102.

In an embodiment, FLD 126 now must determine whether VCO signal 112 is locked to reference signal 102. In order to determine whether FLD 126 VCO signal 112 is locked to reference signal 102, FLD 126 may count the clock cycles of reference signal 102 and VCO signal 112 over a defined period of time. If the count of the reference signal 102 is the same or some error value thereof (e.g., within 1%) from the count of a multiple of the VCO signal 112 that is the multiplier of the frequency from reference signal 102, then VCO signal 112 is deemed to be locked to reference signal 102.

Once FLD 126 makes a determination that VCO signal 112 is locked to reference signal 102, FLD 126 may be switched off. Because FLD 126 is switched off after making the determination that VCO signal 112 is locked to reference signal 102, less energy is consumed within the system. After a predetermined amount of time, in some embodiments a few microseconds, FLD 126 may be switched back on or enabled to again determine whether VCO signal 112 is locked to reference signal 102. Thus, FLD 126 may be turned on at a low duty cycle to minimize the power consumed by it. Even if FLD 126 is configured to run 20% of the time, the power consumed by the PLL 100 is minimized. This process may then repeat itself.

If FLD 126 determines that VCO signal 112 is not locked to reference signal 102, FLD 126 provides signal 130 to MUX 122 to once again provide feedback signal 116 to PFD 104. Additionally, FLD 126 provides signal 128 to divider 114 to power up and is once again enabled. The PLL 100 then operates to lock feedback signal 116 to reference signal 102 again. Once a lock between feedback signal 116 and reference signal 102 is obtained, then FLD 126 once again provides signal 130 to MUX 122 to provide VCO signal 112 to PFD 104 and thus, bypass divider 114. FLD 126 also would once again provide power down signal 128 to divider 114 to power down or disable divider 114. At this point, FLD 126 once again makes periodic determinations of whether VCO signal 112 remains locked to reference signal 102.

Figure 2:
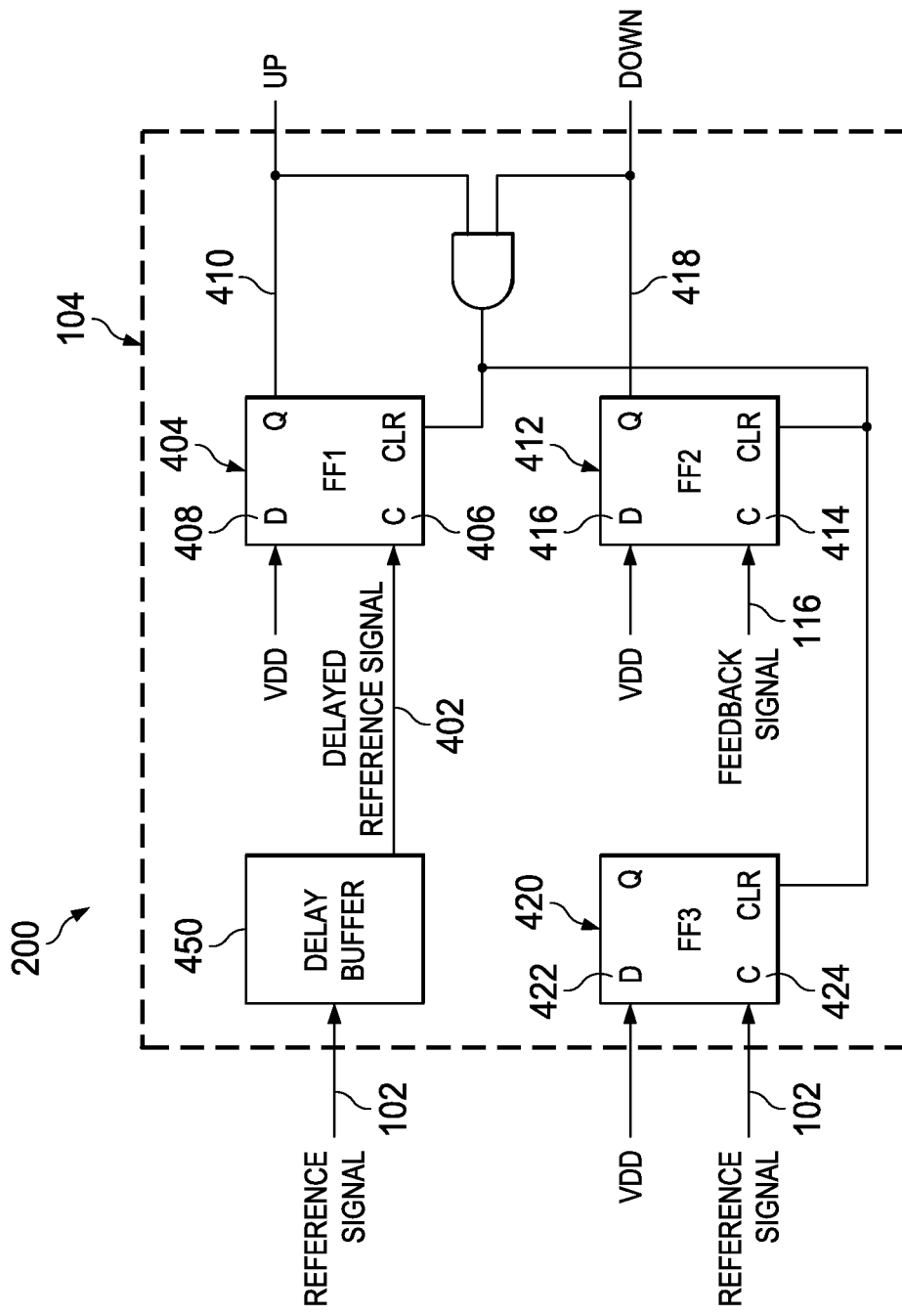
FIG. 2 shows a block diagram of a phase-frequency detector circuit in accordance with various embodiments.

FIG. 2 shows one suitable block diagram 200 of PFD 104. FIG. 2 also illustrates the operation of PFD 104 when reference signal 102 and feedback signal 116 are not locked. PFD 104 includes a delay buffer 450, a first flip flop 404, a second flip flop 412, and a third flip flop 420. Flip flops 404, 412, and 420 may be D flip flops. Delay buffer 450 which may be a digital delay may be configured to receive reference signal 102 and delay reference signal 102 by a predetermined amount of time. The delay may be approximately 200 picoseconds. The output of delay buffer 450 is delayed reference signal 402 which is provided as an input to flip flop 404 as flip flop 404's C input 406. Flip flop 404 may also receive Vdd, power, as its D input 408. Flip flop 404's Q output 410 produces an UP signal once the edge of the delayed reference signal 402 reaches flip flop 404.

Feedback signal 116 is provided to the C input 414 of flip flop 412. Flip flop 412 may also receive Vdd as its D input 416. Flip flop 412's Q output 418 provides a DOWN signal once the edge of feedback signal 116 reaches flip flop 412. Flip flop 420 receives reference signal 102 as its C input 424 and Vdd as its D input 422. With this configuration, PFD 104 acts to compare the frequency and/or phase of feedback signal 116 with the frequency and/or phase of reference signal 402 in preparation for attempting to lock, using PLL 100, feedback signal 116 to reference signal 102.

Figure 3:
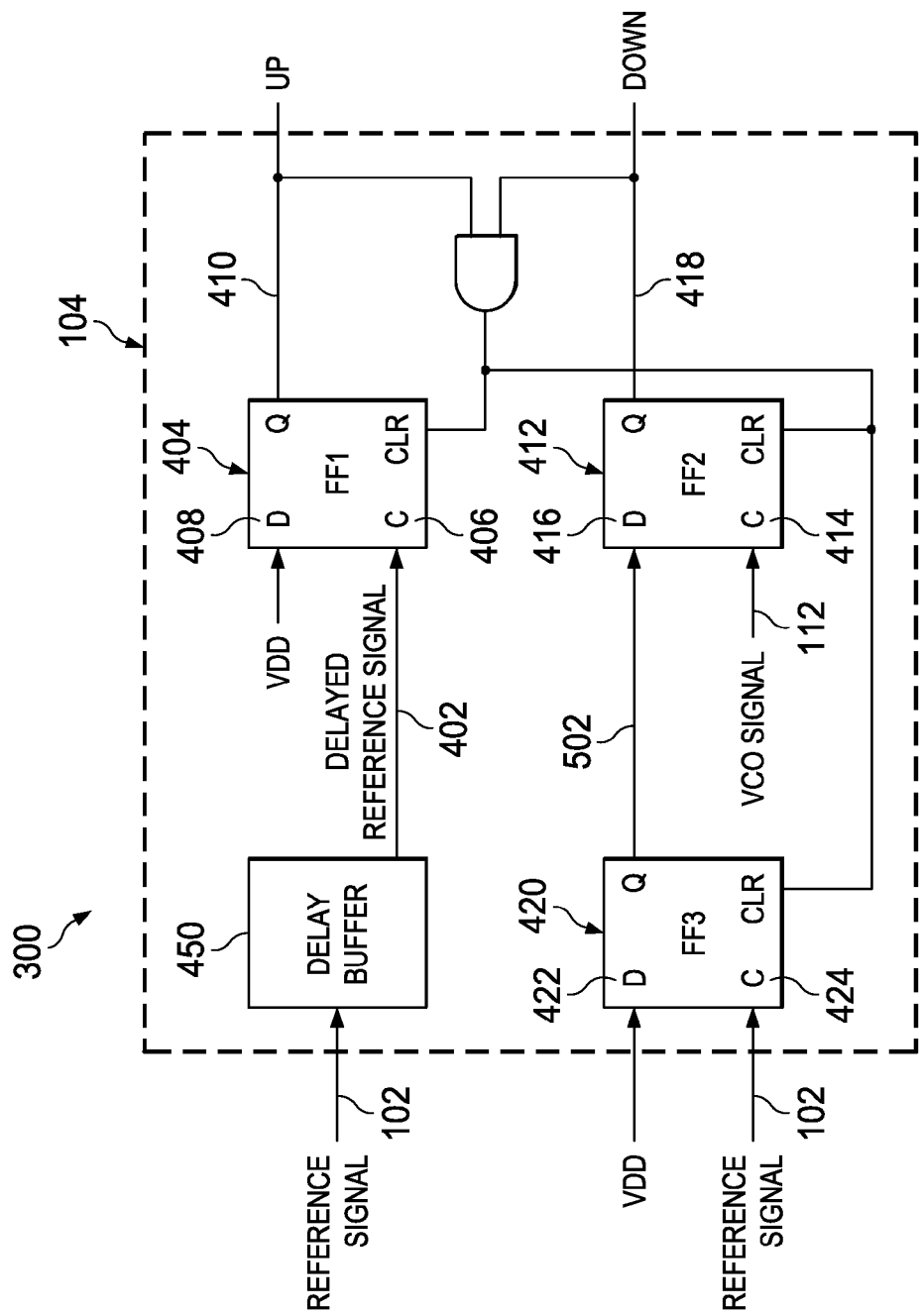
FIG. 3 shows a block diagram of a phase-frequency detector circuit in accordance with various embodiments.

FIG. 3 illustrates the operation of PFD 104 when reference signal 102 and feedback signal 116 become locked. Block diagram 300 may include the same components as block diagram 200 shown in FIG. 2: delay buffer 450, a first flip flop 404, a second flip flop 412, and a third flip flop 420. Block diagram 300 may be the same circuit as block diagram 200 from FIG. 2.

In an embodiment, because VCO signal 112 may be at a higher frequency than reference signal 102, the PFD may have a difficult time comparing an edge of the VCO signal 112 to an edge of the reference signal 102. Thus, PFD 104, may be configured to open for only short periods of time and be idle the remaining periods of time. That is, PFD 104 may only open during the window of time in which the edge of reference signal 102 enters PFD 104. Because the PFD 104 may only be open during this time frame and may be idle at all other times, PFD 104 would only be able to compare the edge of reference signal 102 with the edge of VCO signal 112 that is closest to the edge of reference signal 102.

In an embodiment, flip flop 404 would contain the same inputs and same outputs as discussed under FIG. 2 so that its Q output 410 produces an UP signal once the edge of delayed reference signal 402 reaches flip flop 404. However, the D input 416 of flip flop 412 changes from that discussed under FIG. 2 to being the Q output 502 from flip flop 420. Additionally, the C input 414 for flip flop 412 may be VCO signal 112. In this configuration, as soon as reference signal 102 reaches flip flop 420, its Q output 502 may switch immediately to high. This in turn means that the D input 416 may also be high at the time that the reference signal 102 reaches flip flop 420. Thus, flip flop 412 may be idle and have no input until reference signal 102 reaches flip flop 420. Hence, when the closest edge of VCO signal 112 to the edge of reference signal 102 enters flip flop 412, flip flop 412 may be activated while being idle at all other times. Flip flop 412's Q output 418 produces a DOWN signal once the edge of VCO signal 112 reaches flip flop 412. With this configuration, PFD 104 acts to compare the frequency and/or phase of VCO signal 112 with the frequency and/or phase of reference signal 402 in an attempt to keep a lock, using PLL 100, of VCO signal 112 to reference signal 102.

Figure 4:
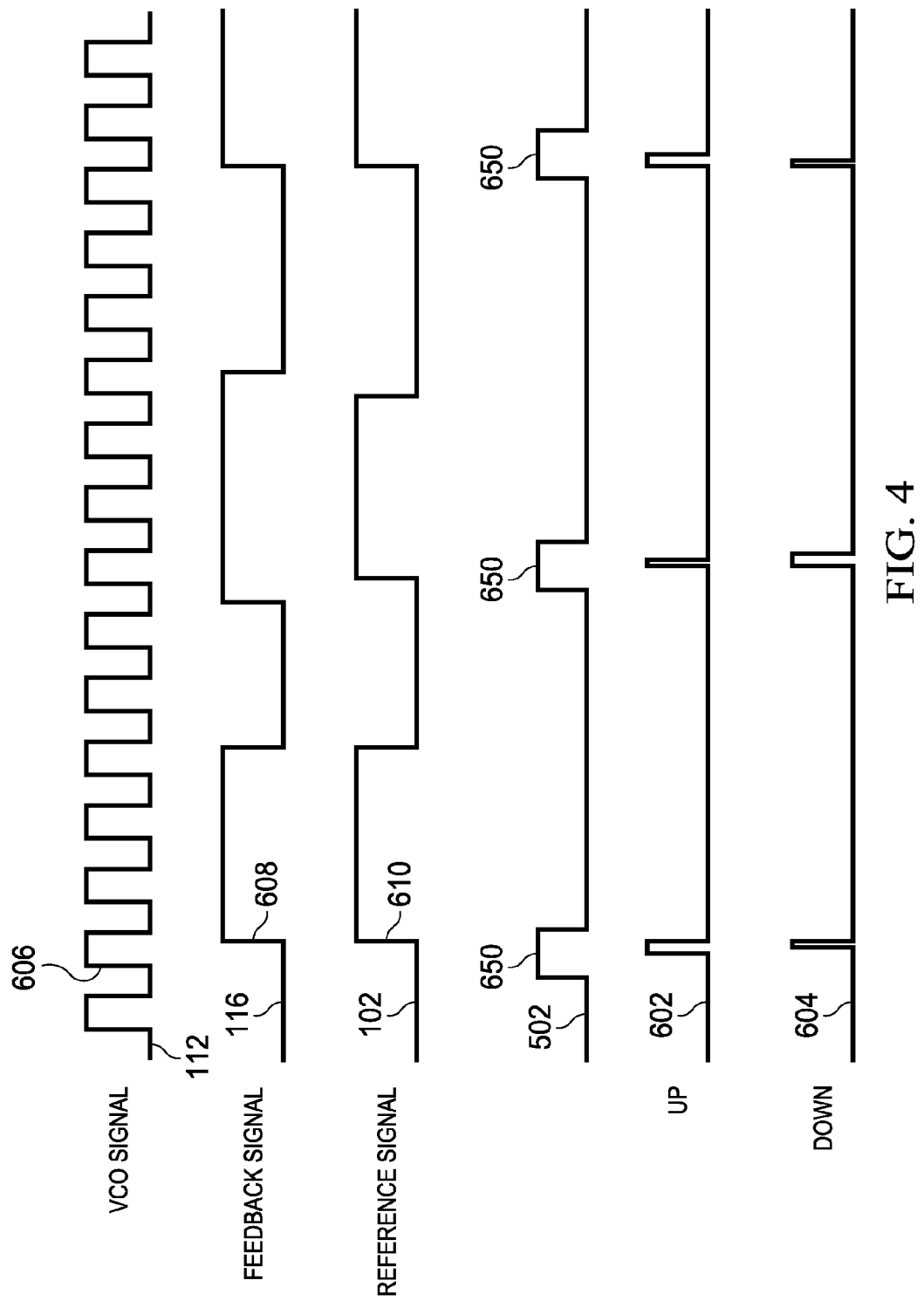
FIG. 4 shows a conceptual illustration of the technique disclosed herein in accordance with various embodiments.

FIG. 4 shows a conceptual illustration of VCO signal 112, feedback signal 116, reference signal 102, Q output signal 502 of flip flop 420 from FIG. 3, UP signal 602 and DOWN signal 604 in accordance with an embodiment of the invention. In an embodiment, VCO signal 112 is at a higher frequency than reference signal 102 and feedback signal 116. VCO signal 112 may be divided by divider 114 from FIG. 1 to create feedback signal 116 at a frequency and/or phase that approximates reference signal 102. When PFD 104 makes its comparison between reference signal 102 and feedback signal 116 and/or VCO signal 112 in PLL 100 from FIG. 1 it may compare reference signal edge 608 with feedback signal edge 610 and/or reference signal edge 608 with VCO signal edge 606.

As noted previously, Q output signal 502 of flip flop 420 enables flip flop 412 from FIG. 3 to be idle and have no input until reference signal 102 reaches flip flop 420. Hence, when the closest edge of VCO signal 112 to the edge of reference signal 102 enters flip flop 412, flip flop 412 may be activated while being idle at all other times. This is illustrated by Q output signal 502. VCO signal edge 606 and reference signal edge 610 occur during the time in which Q output signal 502 is high, labeled 650 in FIG. 4. Thus, PFD 104 only compares VCO signal edge 606 with reference signal edge 610 and none of the other VCO signal edges until the next reference signal edge occurs.

As mentioned previously, and shown in FIG. 4, UP signal 602 may be produced when reference frequency 102 is higher than feedback frequency 116 or VCO signal 112. DOWN signal 604 may be produced when feedback frequency 116 or VCO signal 112 is higher than reference frequency 102.

Figure 5:
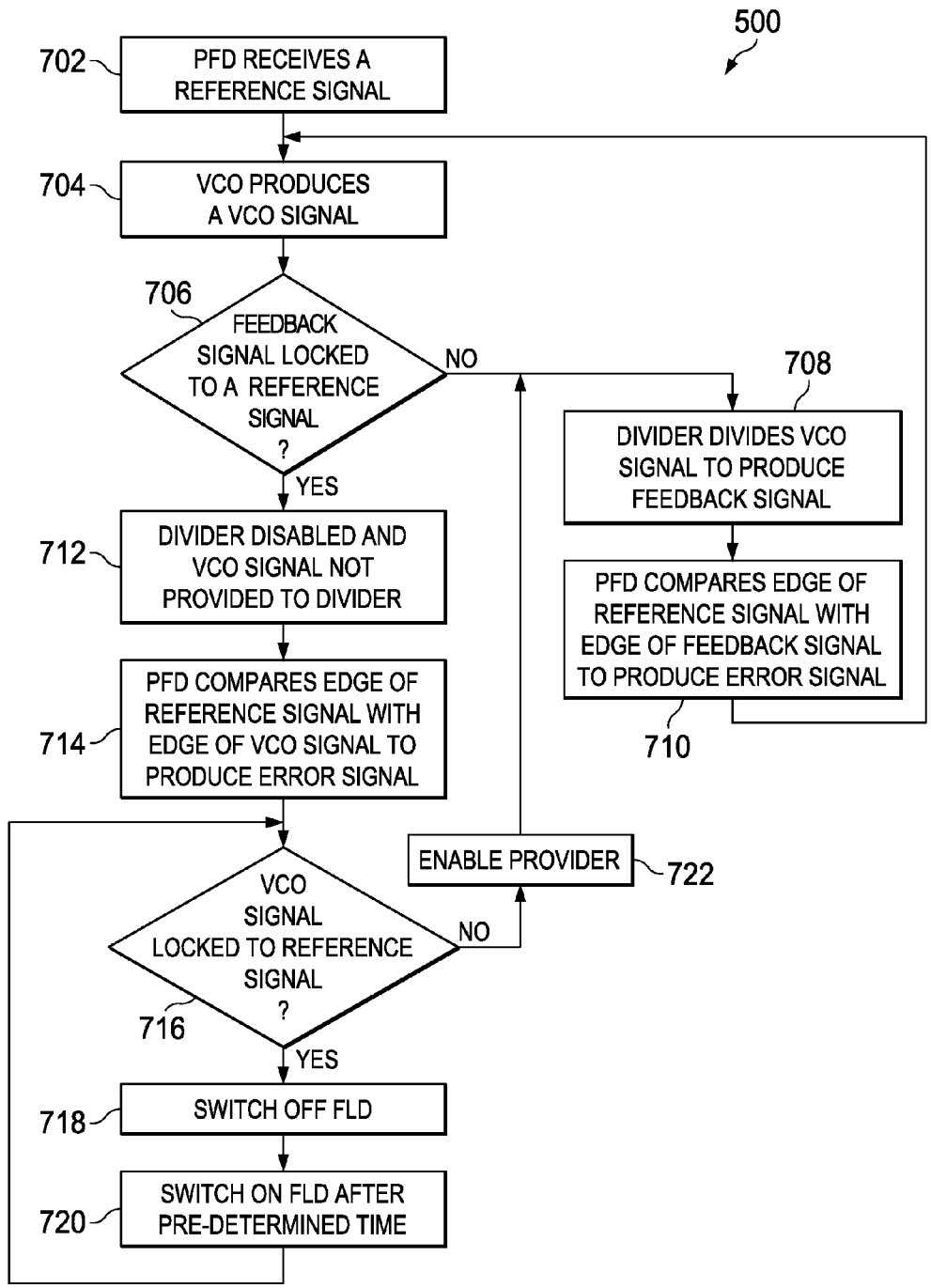
FIG. 5 shows a flow diagram of a method implemented in accordance with various embodiments.

FIG. 5 shows a flow diagram of a method 500 implemented in accordance with various embodiments. The method begins in block 702 in which PFD 104 receives reference signal 102. The method also comprises VCO 110 producing VCO signal 112, as shown in block 704. In block 706, a determination of whether feedback signal 116 is locked to reference signal 102 may be made.

In block 712, if feedback signal 116 is locked to reference signal 102, then divider 114 is disabled and VCO signal 112, in some embodiments, may bypass divider 114. Instead, VCO signal 112 is provided to PFD 104. PFD 104 then may compare the reference signal edge 610 with VCO signal edge 606 to produce error signals 118 and 120, as shown in block 714. In block 716, a determination of whether VCO signal 112 is locked to reference signal 102 may be made. This determination may be made by FLD 126.

In block 718, if VCO signal 112 is locked to reference signal 102, then FLD 126 may be switched off. After a predetermined amount of time, FLD 126 then may be switched back on, as shown in block 720. Another determination of whether VCO signal 112 is locked to reference signal 102 then may be made in block 716 again.

However, if the determination is made in block 716 that VCO signal 112 is not locked to reference signal 102, then divider 114 is enabled as shown in block 722. Divider 114 then may divide VCO signal 112 to produce feedback signal 116 which then is provided to PFD 104, as shown in block 708. In block 710, PFD 104 then may compare reference signal edge 610 with feedback signal edge 608 to produce error signals 118 and 120. Method 500 continues with VCO 110 producing a VCO signal 112, as shown in block 704.

If in block 706, a determination is made that feedback signal 116 is not locked to reference signal 102, then divider 114 then may divide VCO signal 112 to produce feedback signal 116, as shown in block 708. In block 710, PFD 104 then may compare reference signal edge 610 with feedback signal edge 608 to produce error signals 118 and 120. Method 500 continues with VCO 110 producing a VCO signal 112, as shown in block 704.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A phased-locked loop (PLL) circuit comprising:
   a phase-frequency detector (PFD) configured to receive a reference signal;
   a voltage-controlled oscillator (VCO) configured to produce a VCO signal;
   a divider configured to divide the VCO signal thereby producing a feedback signal and
   a frequency lock detector (FLD) configured to determine whether the frequency of the VCO signal is locked to the frequency of the reference signal;
   wherein, when the feedback signal is not locked to the reference signal, the PFD compares an edge of the reference signal with an edge of the feedback signal such that the PFD produces a first error signal,
   wherein, when the feedback signal is locked to the reference signal, the PFD compares the edge of the reference signal to an edge of the VCO signal such that the PFD produces a second error signal and the divider is configured to be disabled;
   wherein after the frequency of the VCO signal is locked to the frequency of the reference signal, the FLD is switched off after a first period of time;
   wherein after the FLD is switched off, the FLD is switched on after a second period of time.

2. The PLL circuit of claim 1, further comprising:
   a charge pump (CP) configured to create an up signal or down signal based on a frequency difference between the reference signal and either the feedback signal or VCO signal determined by the PFD.

3. The PLL circuit of claim 2, wherein the CP is further configured to produce a negative charge based on the CP creating a down signal and a positive charge based on the CP creating an up signal.

4. A method comprising:
   receiving, by a phase-frequency detector (PFD), a reference signal;
   producing, by a voltage-controlled oscillator (VCO), a VCO signal;
   dividing, by a divider, the VCO signal to produce a feedback signal based on the feedback signal not being locked to the reference signal;
   comparing, by the PFD, an edge of the reference signal with an edge of the feedback signal wherein the PFD produce a first error signal based on the feedback signal not being locked to the reference signal;
   comparing, by the PFD, the edge of the reference signal to an edge of the VCO signal wherein the PFD produce a second error signal based on the feedback signal being locked to the reference signal;
   disabling the divider when the feedback signal is locked to the reference signal;
   determining, by a frequency lock detector (FLD), when the frequency of the VCO signal is locked to the frequency of the reference signal;
   switching off the FLD for a first period of time when the frequency of the VCO signal is locked to the frequency of the reference signal; and
   switching on the FLD after the FLD was switched off for a second period of time.

* * * * *